(12) United States Patent
Lin et al.

(10) Patent No.: US 10,930,627 B2
(45) Date of Patent: Feb. 23, 2021

(54) SEMICONDUCTOR PACKAGE DEVICE AND METHOD OF MANUFACTURING THE SAME (71) Applicant: Advanced Semiconductor Engineering, Inc., Kaohsiung (TW)

(72) Inventors: Chang-Yu Lin, Kaohsiung (TW); Chi-Han Chen, Kaohsiung (TW); Chieh-Chen Fu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/236,186

(22) Filed: Dec. 28, 2018

(65) Prior Publication Data

US 2020/0212023 A1      Jul. 2, 2020

(51) Int. Cl.
*H01L 25/16*     (2006.01)
*H01L 33/52*     (2010.01)
*H01L 23/538*    (2006.01)
*H01L 33/58*     (2010.01)
*G02B 6/42*      (2006.01)

(52) U.S. Cl.
CPC ........ *H01L 25/167* (2013.01); *H01L 23/5384* (2013.01); *H01L 33/52* (2013.01); *H01L 33/58* (2013.01); *G02B 6/4206* (2013.01)

(58) Field of Classification Search
CPC ..... H01L 51/56; H01L 51/5253; H01L 33/62; H01L 51/0097; H01L 27/3246
USPC ........................................................... 257/98
See application file for complete search history.

(56) References Cited

U.S. PATENT DOCUMENTS

2018/0045885 A1    2/2018  Canali et al.
2020/0098621 A1*   3/2020  Bharath ............ H01L 21/76837

FOREIGN PATENT DOCUMENTS

EP             0431527 A2 *   6/1991   ........... H01S 5/5045

* cited by examiner

*Primary Examiner* — Andy Huynh
(74) *Attorney, Agent, or Firm* — Foley & Lardner LLP (57) ABSTRACT

A semiconductor device package includes a first semiconductor device having a first surface, an interconnection element having a surface substantially coplanar with the first surface of the first semiconductor device, a first encapsulant encapsulating the first semiconductor device and the interconnection element, and a second semiconductor device disposed on and across the first semiconductor device and the interconnection element.

23 Claims, 11 Drawing Sheets

SEMICONDUCTOR PACKAGE DEVICE AND METHOD OF MANUFACTURING THE SAME

BACKGROUND

1. Technical Field

The subject application relates generally to a semiconductor package device and a method of manufacturing the same.

2. Description of the Related Art

A semiconductor device package includes one or more semiconductor devices. Some of the semiconductor devices may be stacked in the semiconductor device package. Some of the semiconductor devices may be disposed side-by-side in the semiconductor device package. Signal transmission in the semiconductor device package may use conductive traces that provide for lateral transmission. However, a relatively long conductive trace may result in relatively great transmission loss, and such a phenomenon can be significant (e.g. in high-frequency signal transmission).

SUMMARY

In one or more embodiments, a semiconductor device package includes a first semiconductor device having a first surface, an interconnection element having a surface substantially coplanar with the first surface of the first semiconductor device, a first encapsulant encapsulating the first semiconductor device and the interconnection element, and a second semiconductor device disposed on and across the first semiconductor device and the interconnection element.

In one or more embodiments, a method of manufacturing a semiconductor device package includes disposing a first semiconductor device and an interconnection element on a carrier, encapsulating the first semiconductor device and the interconnection element, removing the carrier from the first semiconductor device and the interconnection element, and disposing a second semiconductor device across the first semiconductor device and the interconnection element.

BRIEF DESCRIPTION OF THE DRAWINGS

Aspects of the subject application are readily understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements.

DETAILED DESCRIPTION

A lateral transmission path is reduced or minimized in some embodiments of the subject application. A horizontal transmission path is reduced or minimized in some embodiments of the subject application.

Figure 1:
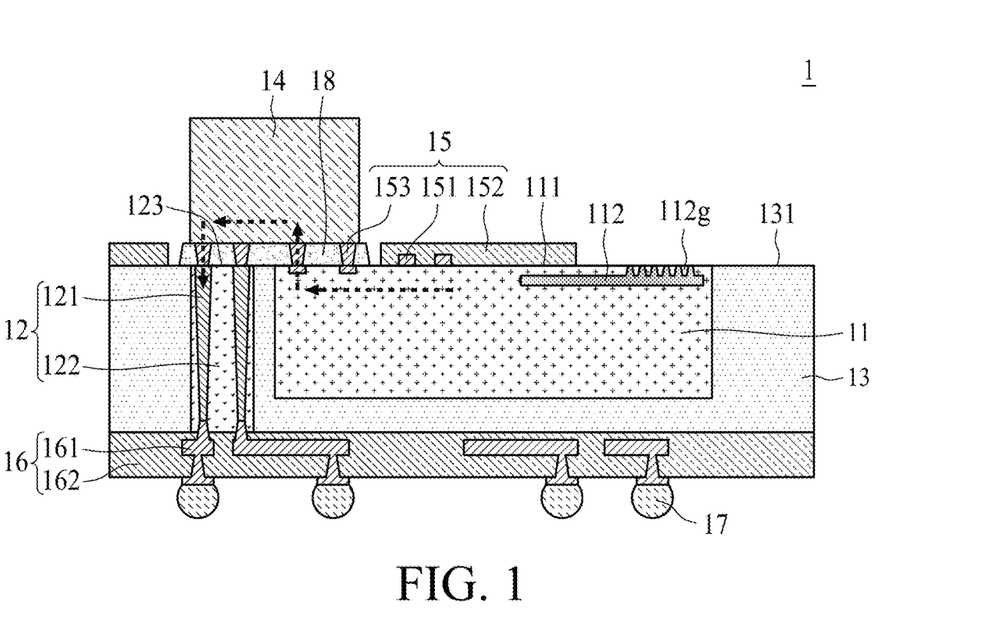
FIG. 1 illustrates a cross-sectional view of a semiconductor device package in accordance with some embodiments of the subject application.

FIG. 1 illustrates a cross-section view of a semiconductor device package 1 in accordance with some embodiments of the subject application. The semiconductor device package 1 comprises a semiconductor device 11, an interconnection element 12, an encapsulant 13, a semiconductor device 14, a redistribution layer (RDL) structure 15, an RDL structure 16, and connection elements 17.

The semiconductor device 11 has a surface 111. The surface 111 may include or may constitute at least part of an active surface. The surface 111 is adjacent to an active side of the semiconductor device 11. The surface 111 is opposite a back side or back surface of the semiconductor device 11.

The semiconductor device 11 may include, for example, but is not limited to, an optical die (e.g. a photonic die), a radio frequency die, a detector, or other integrated circuit.

The semiconductor device 11 includes an optical element 112. The optical element 112 may include a guiding element, such as an optical waveguide. The optical element 112 may include a grating structure 112g. The optical element 112 may be embedded in the semiconductor device 11. The grating structure 112g may be exposed from the surface 111 of the semiconductor device 11. The grating structure 112g (e.g. a grating coupler) may receive light beams from an external optical fiber (not illustrated in FIG. 1), and the received light beams are transmitted via the optical element 112. The optical element 112 may include an optical waveguide, an acoustic waveguide, an electromagnetic waveguide, or the like. The semiconductor device 11 may include an optoelectronic converter (not illustrated in FIG. 1).

The semiconductor device 11 is encapsulated by the encapsulant 13. The surface 111 of the semiconductor device 11 is exposed by the encapsulant 13. The encapsulant 13 has a surface 131. The surface 111 of the semiconductor device 11 is substantially coplanar with the surface 131 of the encapsulant 13. The semiconductor device 11 is disposed adjacent to the surface 131 of the encapsulant 13.

The encapsulant 13 may include an epoxy resin. The encapsulant 13 may include a molding compound (e.g., an epoxy molding compound or other molding compound). The encapsulant 13 may include a polyimide. The encapsulant 13 may include a phenolic compound or material. The encapsulant 13 may include fillers or particles (e.g. silica particles).

The RDL structure 15 is disposed on the encapsulant 13. The RDL structure 15 is disposed on the semiconductor device 11. The RDL structure 15 is electrically connected to the semiconductor device 11. The RDL structure 15 includes one or more conductive traces 151. The RDL structure 15 includes one or more interconnection elements 153. The interconnection elements 153 may include a conductive via. The RDL structure 15 includes a passivation layer 152. The RDL structure 15 may include or may be a single layer structure. The RDL structure 15 may include or may be a multilayer structure in accordance with some embodiments of the subject application.

The interconnection element 12 includes conductive vias 121 and a passivation layer 122. The interconnection element 12 includes an interposer structure. The interconnection element 12 includes a frameboard structure. The interconnection element 12 is encapsulated by the encapsulant 13. The interconnection element 12 has a surface 123. The surface 123 of the interconnection element 12 is exposed by the encapsulant 13. The surface 123 of the interconnection element 12 is substantially coplanar with the surface 111 of the semiconductor device 11. The interconnection element 12 is separated from the semiconductor device 11 by the encapsulant 13. The RDL structure 15 is disposed on the interconnection element 12. The RDL structure 15 is electrically connected to the interconnection element 12.

The semiconductor device 14 is disposed on the RDL structure 15. The semiconductor device 14 is disposed on the semiconductor device 11. The semiconductor device 14 is disposed on the interconnection element 12. The semiconductor device 14 is disposed across the semiconductor device 11 and the interconnection element 12 (e.g. extends at least from a position above the semiconductor device 11 to a position above the interconnection element 12). A surface of the semiconductor device 14 (e.g. a bottom surface) may face and/or be parallel to the surface 111 of the semiconductor device 11. A surface of the semiconductor device 14 (e.g. the bottom surface) may face and/or be parallel to the surface 123 of the interconnection element 12. The semiconductor device 14 may include, for example but is not limited to, a controller die, a processor die, an application specific integrated circuit (ASIC) die, a microcontroller unit (MCU) die, or the like. The semiconductor device 14 is electrically connected to the RDL structure 15. The semiconductor device 14 is electrically connected to the semiconductor device 11 via the RDL structure 15. The semiconductor device 14 is electrically connected to the interconnection element 12 via the RDL structure 15.

Signal transmission according to some embodiments is indicated by dotted arrows shown in FIG. 1. A signal in the semiconductor device 11 can be vertically transmitted to the semiconductor device 14 through the conductive via 153. Thus a lateral or horizontal signal transmission path (e.g. other than the conductive via 153) can be omitted in signal transmission from the semiconductor device 11 to the semiconductor device 14, and vice versa.

A signal in the semiconductor device 14 can be vertically transmitted to the interconnection element 12 through the conductive via 153. Thus a lateral or horizontal signal transmission path (e.g. other than the conductive via 153) can be omitted in signal transmission from the semiconductor device 14 to the interconnection element 12, and vice versa.

The transmission path of the semiconductor device package 1 may thus be minimized, reduced, or made small to mitigate transmission loss.

The RDL structure 16 is disposed on the encapsulant 13. The RDL structure 16 includes an interconnection structure 161 and a passivation layer 162. The RDL structure 16 is electrically connected to the interconnection element 12.

The connection elements 17 are disposed on the RDL structure 16. The connection element 17 may include a solder ball, solder paste, a presolder or other suitable material(s).

An encapsulant 18 is disposed between semiconductor device 14 and the encapsulant 13. An encapsulant 18 is disposed between semiconductor device 14 and the semiconductor device 11. An encapsulant 18 is disposed between semiconductor device 14 and the interconnection element 12. The encapsulant 18 may include a capillary underfill (CUF), a molded underfill (MUF) or a dispensing gel, depending on design specifications.

Figure 2:
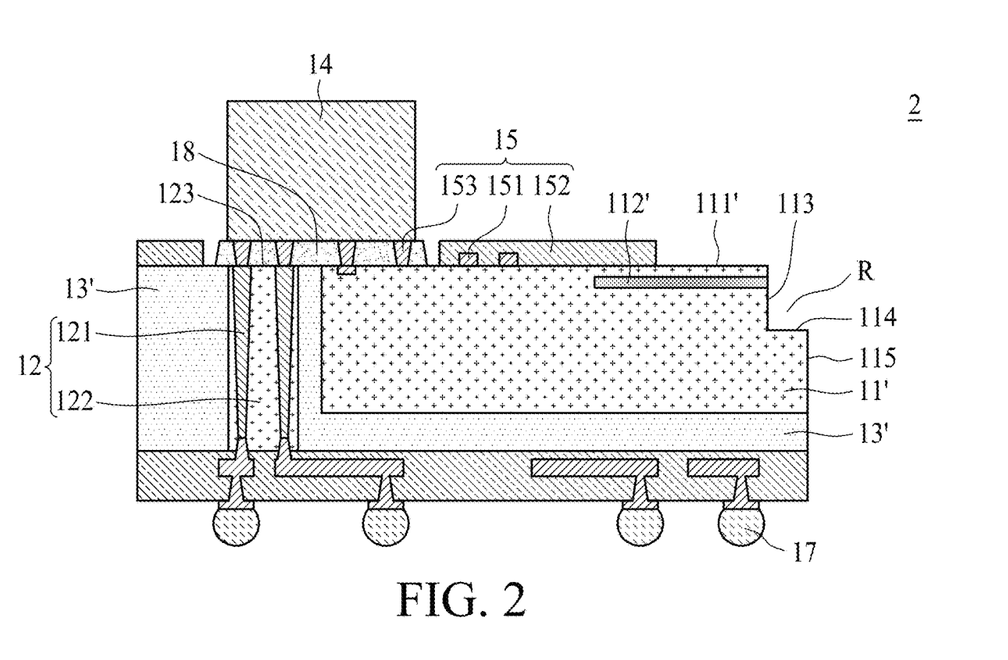
FIG. 2 illustrates a cross-sectional view of a semiconductor device package in accordance with some embodiments of the subject application.

FIG. 2 illustrates a cross-section view of a semiconductor device package 2. The semiconductor device package 2 is similar to the semiconductor device package 1 as described and illustrated with reference to FIG. 1, except that the semiconductor device 11 is replaced by a semiconductor device 11' and the encapsulant 13 is replaced by an encapsulant 13'.

The semiconductor device 11' is similar to the semiconductor device 11 except a recess, a groove, or a trench R is defined by the semiconductor device 11' which can receive an external optical fiber (not illustrated in FIG. 2). The semiconductor device 11' may include an optical element 112'. The optical element 112' may include a guiding element, such as an optical waveguide. The optical element 112' may be embedded in the semiconductor device 11. The optical element 112' may be exposed by the encapsulant 13'. The recess, groove, or trench R may expose the optical element 112'. The optical element 112' (e.g. an edge coupler) may receive light beams from an external optical fiber (not illustrated in FIG. 2), and the received light beams are transmitted via the optical element 112'. The optical element 112' may include an optical waveguide, an acoustic waveguide, an electromagnetic waveguide, or the like.

The semiconductor device 11' is encapsulated by the encapsulant 13'. The semiconductor device 11' has a surface 113 adjacent to a surface 111'. The surface 111' is substantially coplanar with the surface 123 of the interconnection element 12. The surface 113 is orthogonal to the surface 111'. The optical element 112' is exposed from the surface 113. The surface 113 is exposed from the encapsulant 13'.

The semiconductor device 11' has a surface 114. The surface 114 is adjacent to the surface 113. The surface 114 is exposed by the encapsulant 13'. The surface 114 may be substantially parallel to the surface 111'.

The semiconductor device 11' has a surface 115 which is exposed by the encapsulant 13'.

Figure 3:
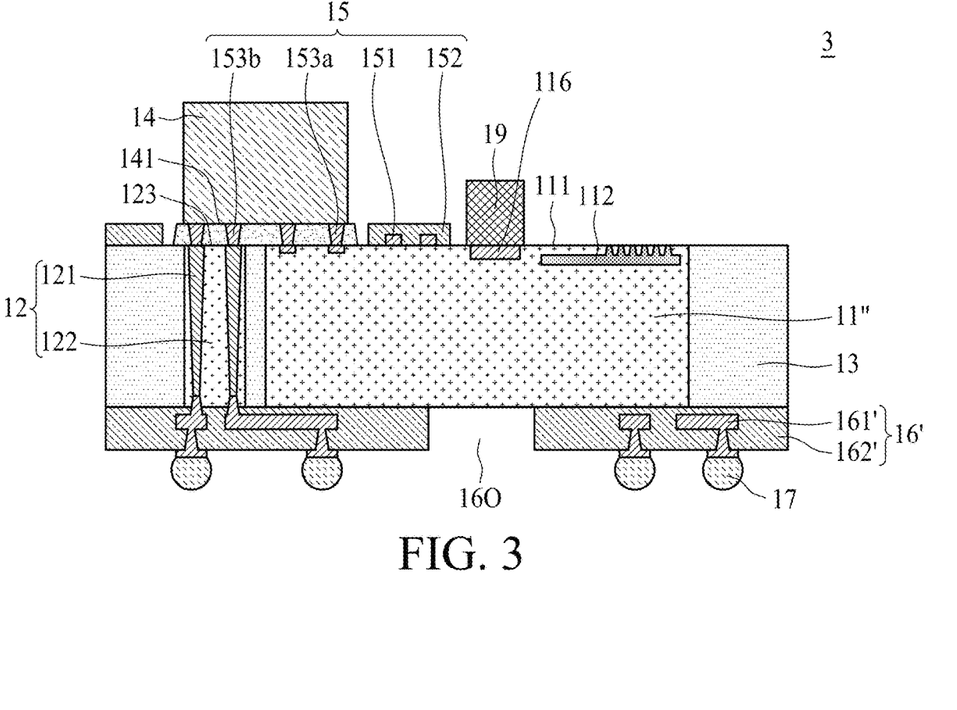
FIG. 3 illustrates a cross-sectional view of a semiconductor device package in accordance with some embodiments of the subject application.

FIG. 3 illustrates a cross-section view of a semiconductor device package 3. The semiconductor device package 3 is similar to the semiconductor device package 1 as described and illustrated with reference to FIG. 1, except that the semiconductor device 11 is replaced by a semiconductor device 11" and the RDL 16 is replaced by an RDL 16', and a light emitting device 19 is included.

The light emitting device 19 is disposed on the semiconductor device 11". The light emitting device 19 may include a laser diode. The optical element 112 of the semiconductor device 11" receives light emitted from the light emitted device 19. The optical element 112 may receive optical signals from an external optical fiber (not illustrated in FIG. 3). The semiconductor device 11" may include an optoelectronic converter for converting optical signals from the light emitting device 19 and/or from the external optical fiber.

The RDL 16' is disposed on the encapsulant 13. The RDL structure 16' includes an interconnection structure 161' and a passivation layer 162'. The RDL structure 16' defines an opening 16O. The RDL structure 16' is electrically connected to the interconnection element 12. The opening 16O is disposed on a side of the encapsulant 13 opposite to the light emitting device 19. The area of the opening 16O is greater than the area of the light emitting device 19 occupied on the surface 111 of the semiconductor device 16". The area of the opening 16O is greater than the area of a conductive pad 116 (e.g. a bond pad) of the semiconductor device 11" bonded to the light emitting device 19. A projection of the light emitting device 19 toward the opening 16O falls within the area of the opening 16O. The projection of the light emitting device 19 on to the RDL structure 16' falls within (e.g., falls entirely within) the area of the opening 16O. The light emitting device 19 is disposed above and between sides of the opening 16O.

The RDL 15 is disposed on the surface 111 of the semiconductor device 11". The RDL 15 is disposed on the surface 123 of the interconnection element 12. The semiconductor device 14 is disposed on the RDL 15. The bottom surface 141 of the semiconductor device 14 is substantially parallel to the surface 111 of the semiconductor device 11". The surface 141 of the semiconductor device 14 is substantially parallel to the surface 123 of the interconnection element 12.

An interconnection element 153a is disposed between the semiconductor device 11" and the semiconductor device 14. An interconnection element 153b is disposed between the interconnection element 12 and the semiconductor device 14. A height of the interconnection element 153a is substantially the same as a height of the interconnection element 153b.

Figure 4A:
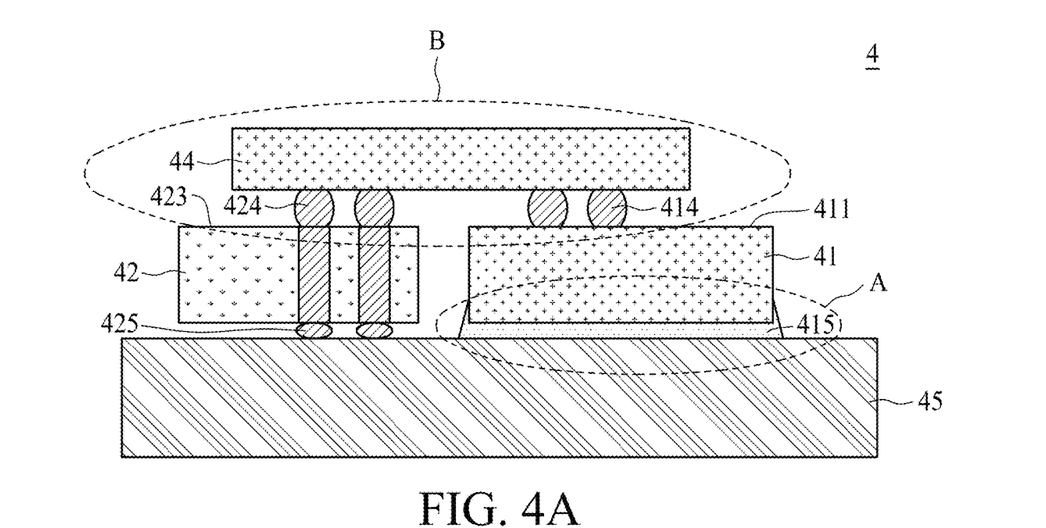
FIG. 4A illustrates a cross-sectional view of a semiconductor device package in accordance with a comparative example.

FIG. 4A illustrates a cross-section view of a semiconductor device package 4 in accordance with a comparative example. The semiconductor device package 4 includes a semiconductor device 41, a carrier 42, a semiconductor device 44, a carrier 45, an adhesive layer 415 and connection elements 414, 424 and 425. The semiconductor device 41 is electrically connected to the semiconductor device 44 via connection elements 414. The semiconductor device 44 is electrically connected to the carrier 42 via connection elements 424. The carrier 42 is electrically connected to the carrier 45 via connection elements 425. The semiconductor device 41 is attached to the carrier 45 by the adhesive layer 415.

Figure 4B:
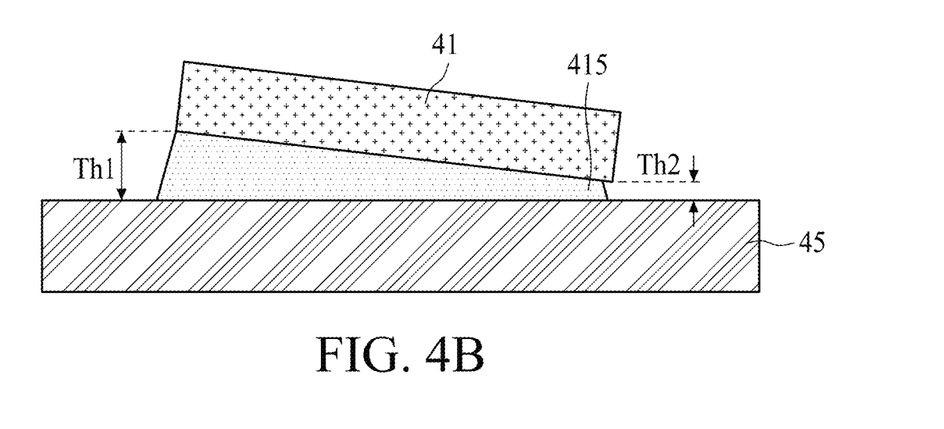
FIG. 4B illustrates an enlarged view of a portion of the semiconductor device package shown in FIG. 4A.

FIG. 4B illustrates an enlarged view of a portion of the semiconductor device package 4 in a dotted-circle "A" as shown in FIG. 4A. Referring to FIG. 4B, a bond-line thickness (BLT) of the adhesive layer 415, which is the thickness of the adhesive layer 415 between the bottom surface of the semiconductor device 41 and the top surface of the carrier 45, may be uneven. The adhesive layer 415 may have a thickness Th1 at one side and another thickness Th2, which is different from the thickness Th1, at another side. Such uneven BLT may be caused by characteristics of the adhesive (e.g. a viscosity, a temperature, a volume of the adhesive and the like). A thickness difference may lead to tilting of the semiconductor device 41.

Figure 4C:
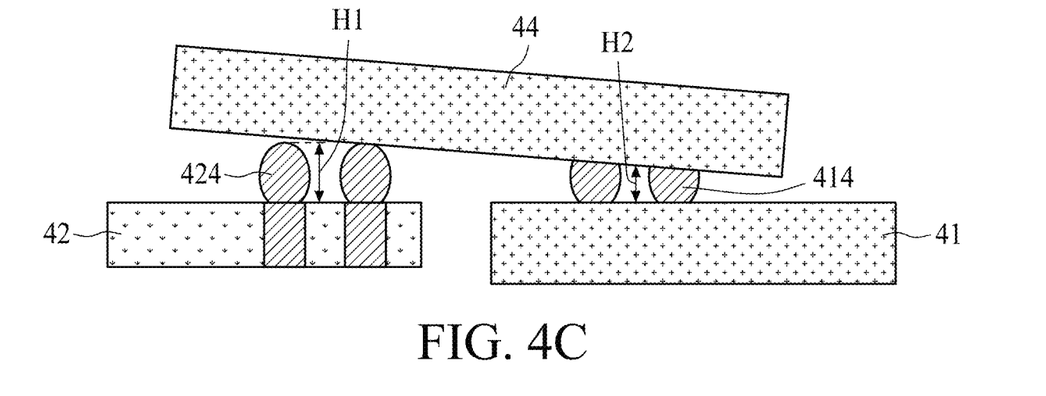
FIG. 4C illustrates an enlarged view of a portion of the semiconductor device package shown in FIG. 4A.

FIG. 4C illustrates an enlarged view of a portion of the semiconductor device package 4 in a dotted-circle "B" as shown in FIG. 4A. The connection elements 414 may include solder balls. The connection elements 414 may include conductive bumps or posts. The connection elements 424 may include solder balls. The connection elements 424 may include conductive bumps or posts.

The connection element 424 has a height H1. The connection element 414 has a height H2. The height H1 is greater than the height H2. There may be a height difference among the connection elements 414 and 424 (e.g. resulting from a manufacturing deviation or tolerance). The height difference between the connection elements 414 and 424 may lead to tilting of the semiconductor device 44, which can adversely affect a reliability of the connection elements 414 and 424 and may cause damage to the semiconductor device package 4 (e.g. breaking or cracking of the connection elements 414 and 424).

It may be challenging to manufacture or make solder balls with an identical diameter. Furthermore, it may be challenging to control a size or a height of the solder balls subsequent to a reflow operation. For example, it may be challenging to manufacture or make conductive posts with an identical height because a deviation or a tolerance is highly likely in certain operations (e.g. plating, etching or other operation(s)).

FIG. 5A, FIG. 5B, FIG. 5C and FIG. 5D illustrate a method of manufacturing a semiconductor device package in accordance with some embodiments of the subject application.

Figure 5A:
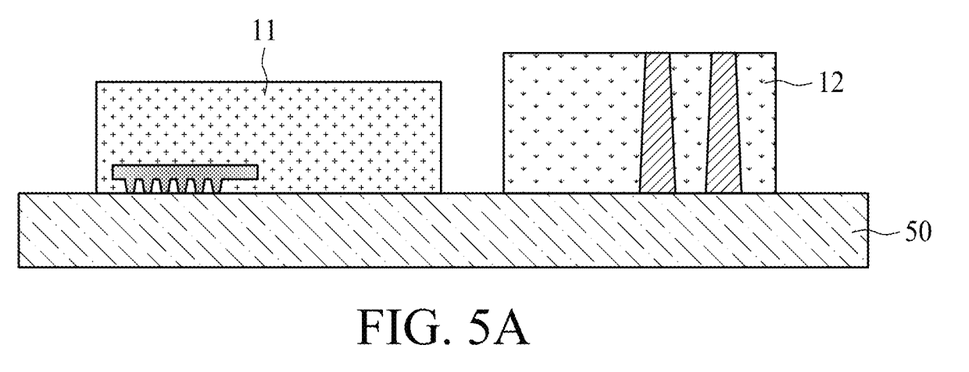
FIG. 5A, FIG. 5B, FIG. 5C and FIG. 5D illustrate a method of manufacturing a semiconductor device package in accordance with some embodiments of the subject application.

Referring to FIG. 5A, a carrier 50 is provided. A semiconductor device 11 and an interconnection element 12 are disposed on the carrier 50. The carrier 50 may include a tape, or other releasable material(s).

Figure 5B:
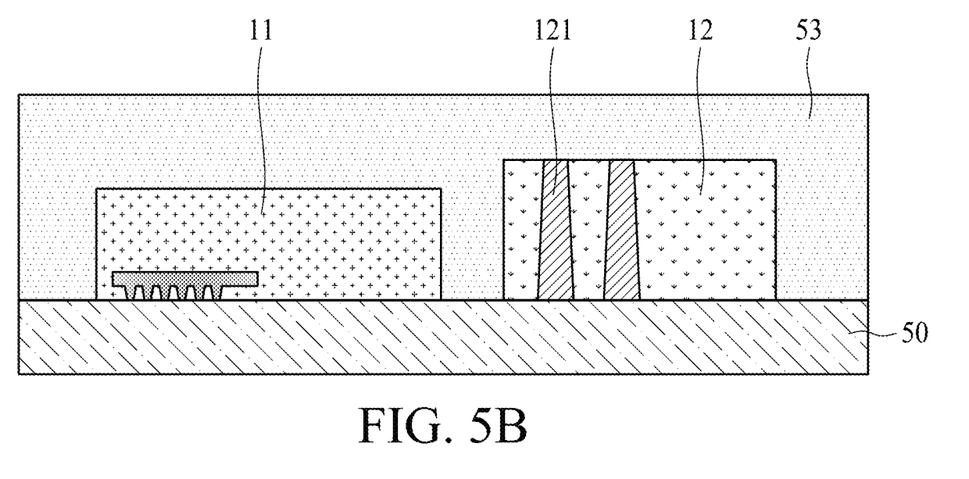

Referring to FIG. 5B, an encapsulant 53 is formed to encapsulate the semiconductor device 11 and the interconnection element 12.

Figure 5C:
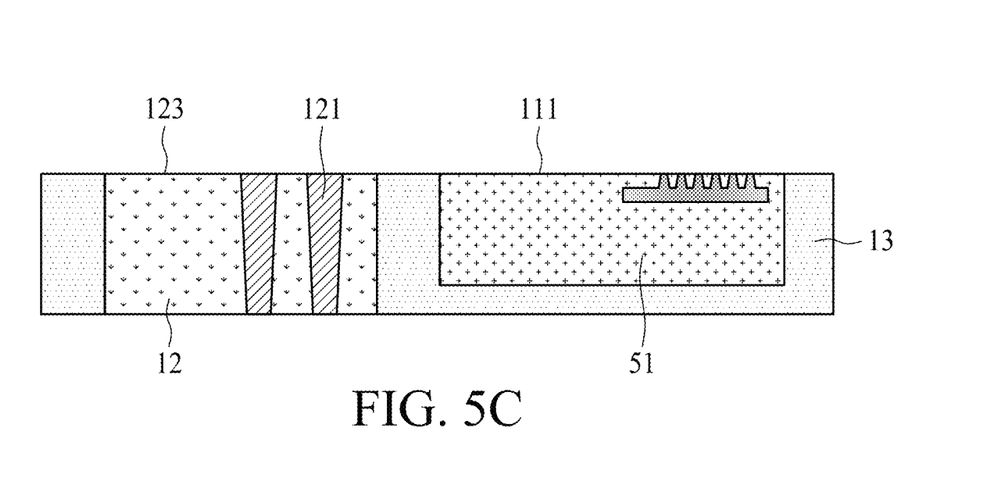

Referring to FIG. 5C, a thinning or planarization operation is applied to the encapsulant 53 to form an encapsulant 13. A thinning operation is applied to the encapsulant 53 to expose conductive vias 121 of the interconnection element 12. The carrier 50 is removed from the semiconductor device 11 and the interconnection element 12. A surface 111 of the semiconductor device 11 and a surface 123 of the interconnection element 12, which are attached to a same surface of the carrier 50 prior to the decarrier operation, are substantially coplanar.

Figure 5D:
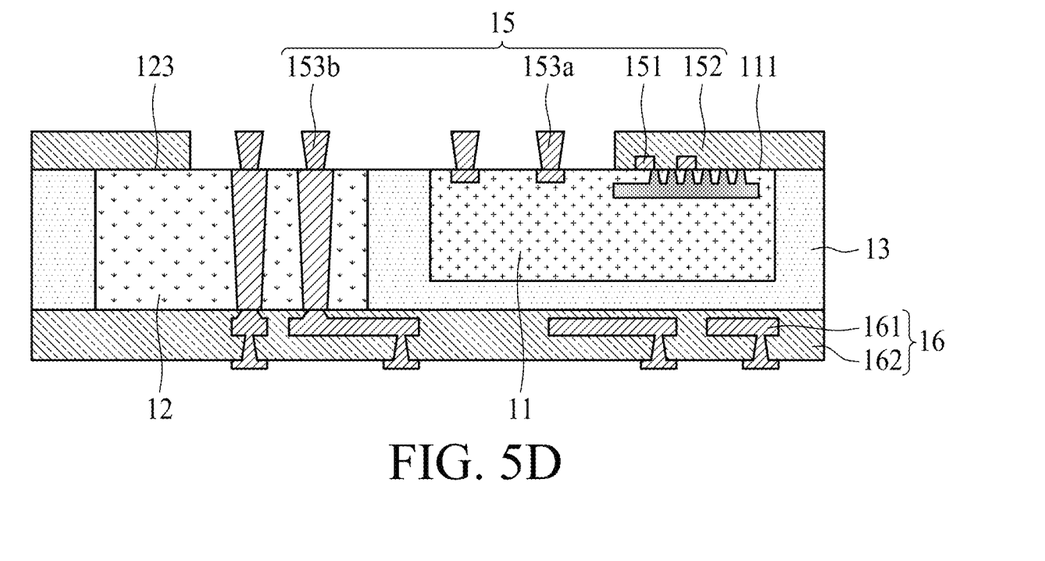

Referring to FIG. 5D, an RDL 15 is formed on the surface 111 of the semiconductor device 11 and the surface 123 of the conductive element 12. The RDL 15 is formed on the encapsulant 13. The RDL 15 includes one or more conductive traces 151, a passivation layer 152 and conductive vias 153a and 153b.

An RDL 16 is formed on the encapsulant 13 on a side of the encapsulant 13 opposite to the RDL 15. The RDL 16 includes an interconnection structure 161 and a passivation layer 162. A semiconductor device 14 is bonded to the conductive vias 153a and 153b through a bonding technique, and an encapsulant 18 is applied to form the semiconductor device package 1 as shown in FIG. 1.

FIG. 6A, FIG. 6B, FIG. 6C and FIG. 6D illustrate a method of manufacturing a semiconductor device package in accordance with some embodiments of the subject application.

Figure 6A:
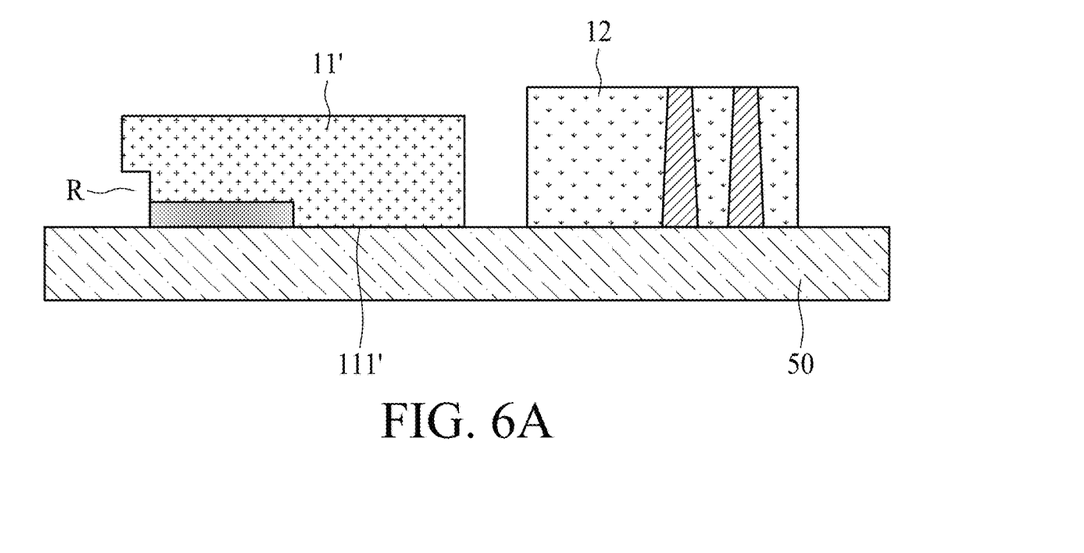
FIG. 6A, FIG. 6B, FIG. 6C and FIG. 6D illustrate a method of manufacturing a semiconductor device package in accordance with some embodiments of the subject application.

Referring to FIG. 6A, a semiconductor device 11' and an interconnection element 12 are disposed on a carrier 50. The semiconductor device 11' defines a recess, groove or trench R in the surface 111' and adjacent to an edge or a lateral surface of the semiconductor device 11'.

Figure 6B:
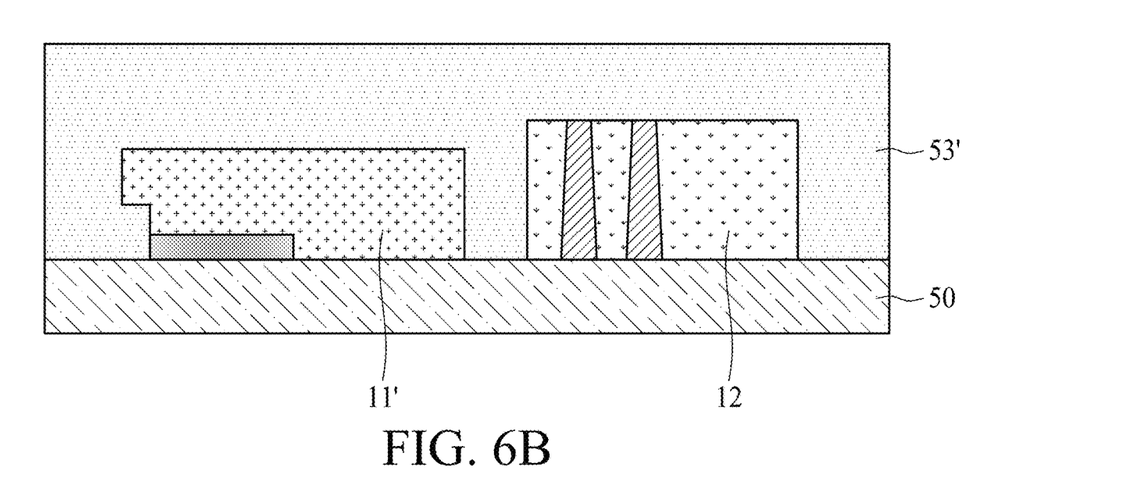

Referring to FIG. 6B, the semiconductor device 11' and the interconnection element 12 are encapsulated by an encapsulant 53'.

Figure 6C:
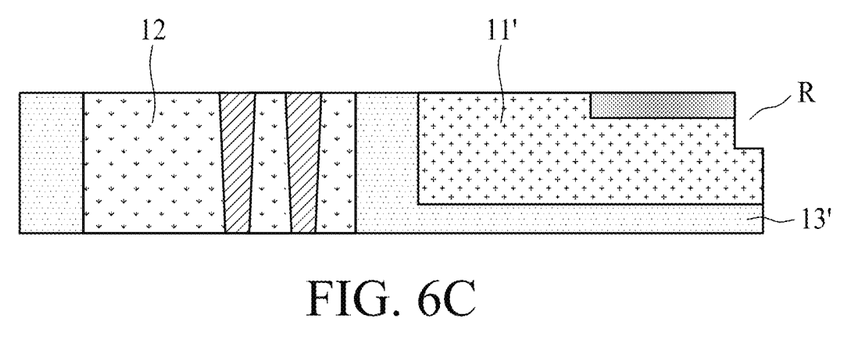

Referring to FIG. 6C, a trimming or planarization operation is performed to form an encapsulant 13'. Then, the carrier 50 is removed from the encapsulated semiconductor device 11' and interconnection element 12.

Figure 6D:
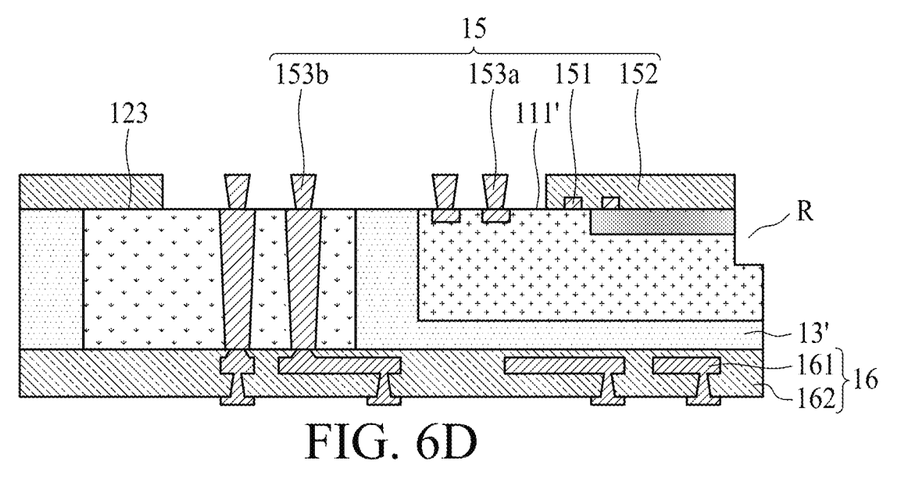

Referring to FIG. 6D, an RDL 15 is formed on a surface 111' of the semiconductor device 11' and a surface 123 of the conductive element 12. The RDL 15 is formed on the encapsulant 13'. The RDL 15 includes one or more conductive traces 151, a passivation layer 152 and conductive vias 153a and 153b.

An RDL 16 is formed on the encapsulant 13' on a side of the encapsulant 13 opposite to the RDL 15. The RDL 16 includes an interconnection structure 161 and a passivation layer 162.

A semiconductor device 14 is bonded to the conductive vias 153a and 153b through a bonding technique, and an encapsulant 18 is applied to form the semiconductor device package 2 as shown in FIG. 2.

FIG. 7A, FIG. 7B, FIG. 7C and FIG. 7D illustrate a method of manufacturing a semiconductor device package in accordance with some embodiments of the subject application.

Figure 7A:
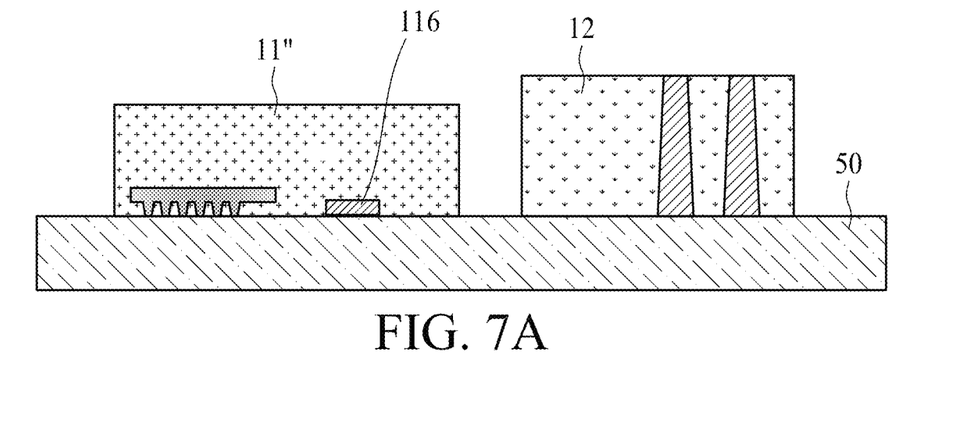
FIG. 7A, FIG. 7B, FIG. 7C and FIG. 7D illustrate a method of manufacturing a semiconductor device package in accordance with some embodiments of the subject application.

Referring to FIG. 7A, a semiconductor device 11" and an interconnection element 52 are disposed on a carrier 50.

Figure 7B:
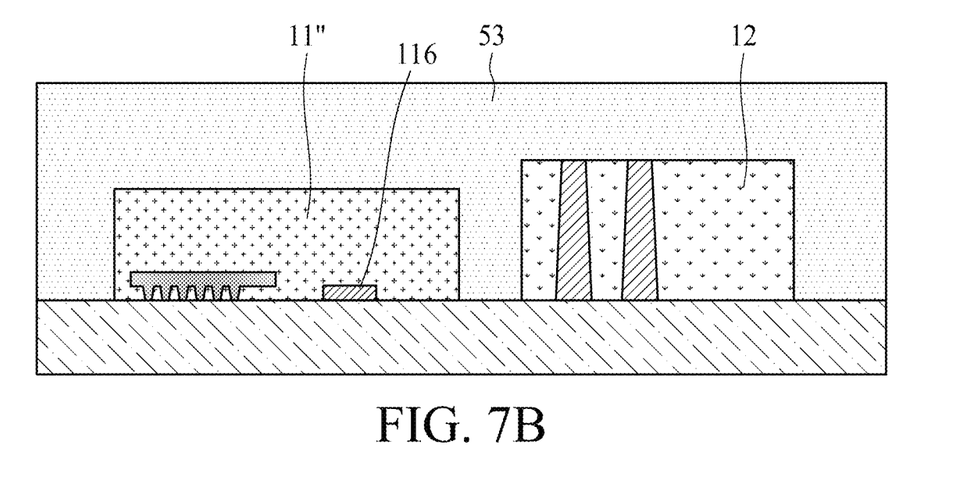

Referring to FIG. 7B, the semiconductor device 11" and the interconnection element 12 are encapsulated by an encapsulant 53.

Figure 7C:
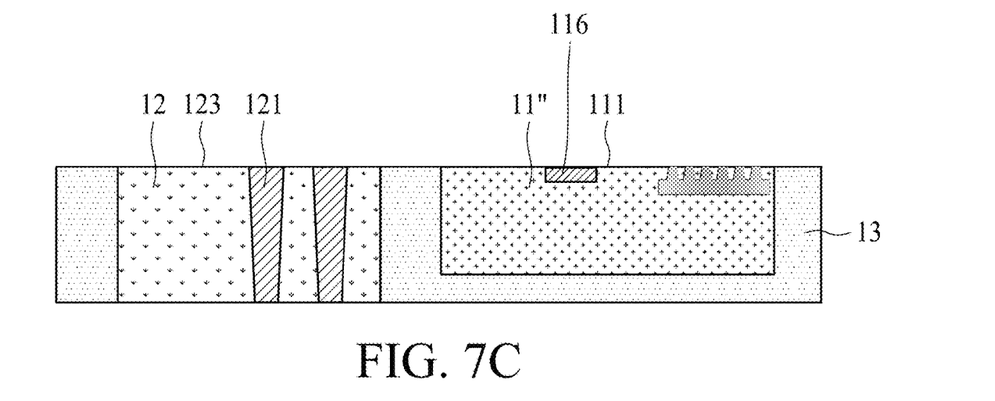

Referring to FIG. 7C, a thinning or planarization operation is applied to the encapsulant 53 to form an encapsulant 13. A thinning or planarization operation is applied to the encapsulant 53 to expose conductive vias 121 included in the interconnection element 12. The carrier 50 is removed from the semiconductor device 11 and the interconnection element 12. A surface 111 of the semiconductor device 11 and a surface 123 of the interconnection element 12, which are attached to a same surface of the carrier 50 prior to the decarrier operation, are substantially coplanar.

Figure 7D:
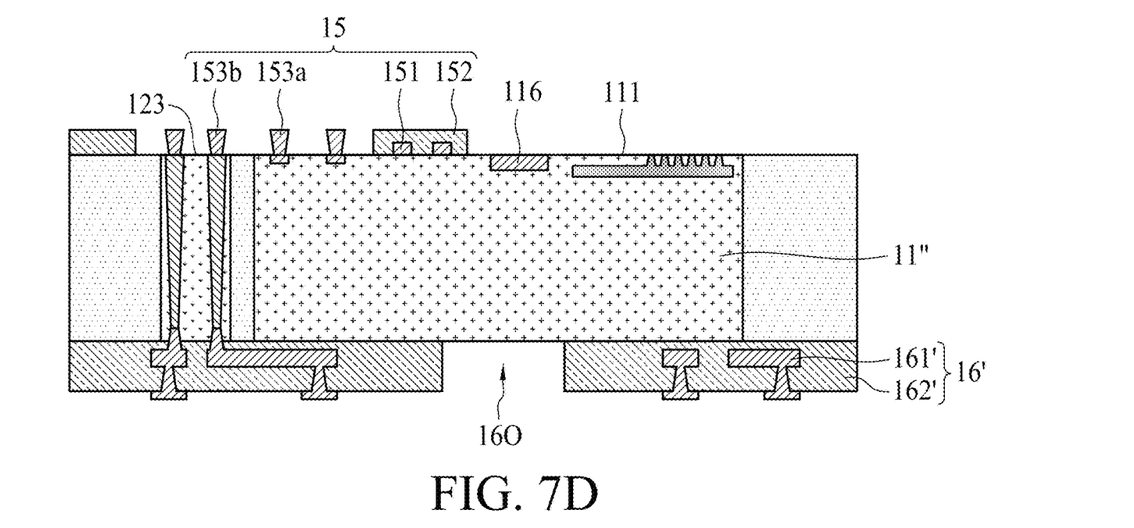

Referring to FIG. 7D, an RDL 15 is formed on the surface 111 of the semiconductor device 11 and the surface 123 of the conductive element 12. The RDL 15 is formed on the encapsulant 13. The RDL 15 includes one or more conductive traces 151, a passivation layer 152 and conductive vias 153a and 153b.

An RDL 16' is formed on the encapsulant 13 on a side of the encapsulant 13 opposite to the RDL 15. The RDL 16' includes an interconnection structure 161' and a passivation layer 162'. The RDL 16' defines an opening 16O.

A semiconductor device 14 is bonded to the conductive vias 153a and 153b through a bonding technique, a light emitting element 19 is bonded to the semiconductor device 11" via a laser bonding technique, and an encapsulant 18 is applied to form the semiconductor device package 3 as shown in FIG. 3.

The semiconductor device 11" includes a conductive pad or a bond pad 116 for bonding with the light emitting element 19. The area of the pad 116 is smaller than the area of the opening 16O. The pad 116 is exposed by the RDL 15. A bonding material is, for example but not limited to, a solder material, an adhesive, or the like, and may be disposed on the pad 116 before bonding the semiconductor device 14 to the pad 116. A laser can pass through the opening 16O and the semiconductor device 11" to cure or reflow the bonding material as discussed above. The laser used to cure or reflow the bonding material as discussed above may, in some embodiments, be substantially not absorbed by the semiconductor device 11". The semiconductor device 11" may be substantially transmissive to the laser (e.g. may be about 80% or more transmissive, about 90% or more transmissive, about 95% or more transmissive, or about 99% or more transmissive).

Figure 8A:
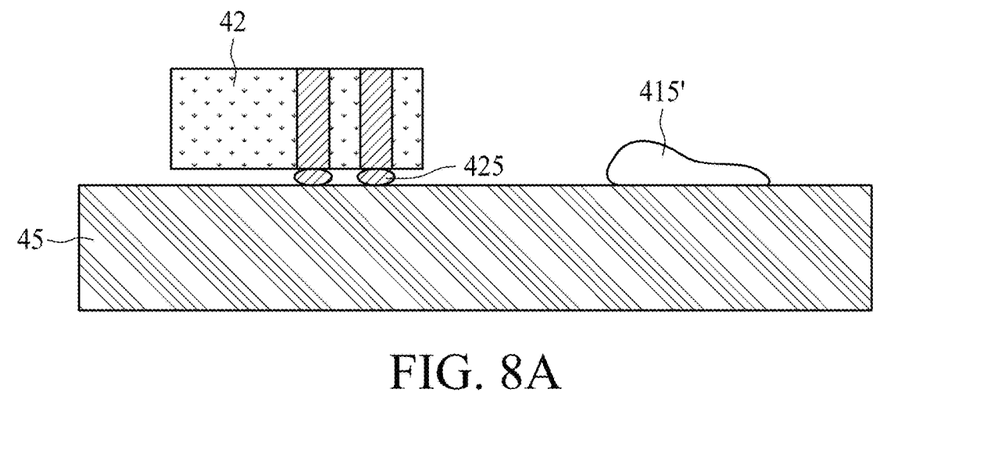
FIG. 8A, FIG. 8B and FIG. 8C illustrate a comparative method of manufacturing a semiconductor device package.
Figure 8B:
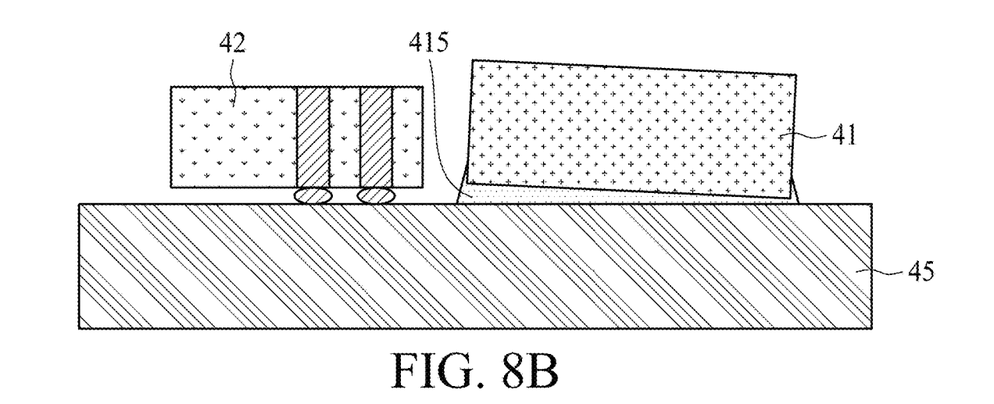
Figure 8C:
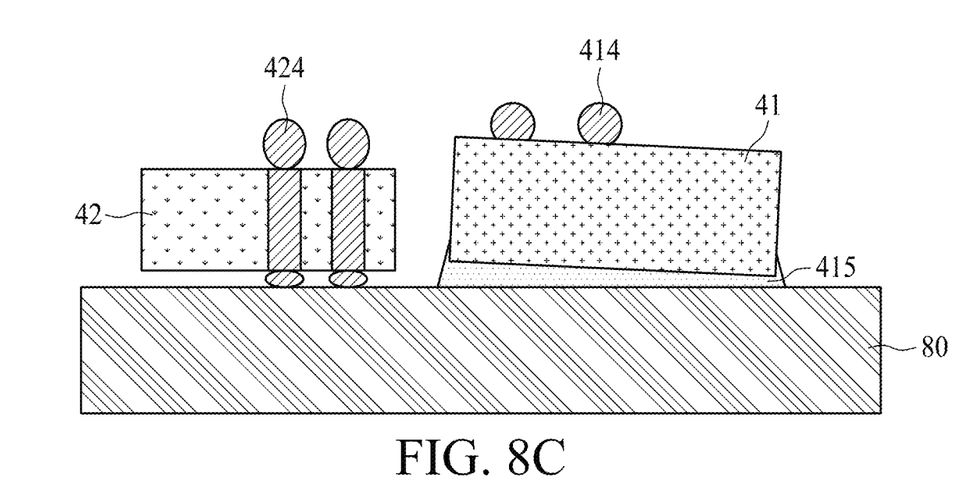

FIG. 8A, FIG. 8B and FIG. 8C illustrate a method of manufacturing a semiconductor device package in accordance with a comparative example.

Referring to FIG. 8A, a carrier 42 is bonded to a carrier 45. An adhesive or adhesive material 415' is formed on the carrier 45. The carrier 42 is bonded to the carrier 45 via connection elements 425. The connection elements 425 may include solder balls.

There may be a height difference among the connection elements 425 (e.g. resulting from a manufacturing deviation or tolerance). A height difference among the connection elements 425 may lead to tilting of the carrier 42.

Referring to FIG. 8B, a semiconductor device 41 is attached to the carrier 45. The semiconductor device 41 is attached to the carrier 45 by the adhesive material 415'. After attaching the semiconductor device 41 onto the adhesive material 415', a curing operation may be performed to cure adhesive material 415' to form an adhesive layer 415. The adhesive layer 415 may have an uneven BLT caused by characteristics of the adhesive 415' (e.g. a viscosity, a temperature, a volume of the adhesive 415' and the like). An unevenness of the thickness of the adhesive layer 415 may lead to tilting of the semiconductor device 41.

Referring to FIG. 8C, connections elements 424 are formed on the carrier 42. Connections elements 414 are formed on the semiconductor device 41. The connections elements 424 may be formed by, for example but not limited to, implantation techniques. The connections elements 414 may be formed by, for example but not limited to, implantation techniques.

The connection elements 414 may include solder balls. The connection elements 414 may include conductive bumps or posts. The connection elements 424 may include solder balls. The connection elements 424 may include conductive bumps or posts.

There may be a height difference among the connection elements 414 (e.g. resulting from a manufacturing deviation or tolerance). There may be a height difference among the connection elements 414 (e.g. resulting from a manufacturing deviation or tolerance).

A semiconductor device 44 is bonded to the semiconductor device 41 and the carrier 42, and a reflow operation is performed to form the semiconductor device package 4 as shown in FIG. 4, according to the present comparative example.

It may be challenging to manufacture or make solder balls with an identical diameter. Furthermore, it may be challenging to control a size or a height of the solder balls subsequent to a reflow operation. For example, it may be challenging to manufacture or make conductive posts with an identical height because a deviation or a tolerance is highly likely in certain operations (e.g. plating, etching or other operation(s)).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the subject application has been described and illustrated with reference to specific embodiments thereof, these descriptions and illustrations do not limit the subject application. It can be clearly understood by those skilled in the art that various changes may be made, and equivalent components may be substituted within the embodiments without departing from the true spirit and scope of the subject application as defined by the appended claims. The illustrations may not necessarily be drawn to scale. There may be distinctions between the artistic renditions in the subject application and the actual apparatus, due to variables in manufacturing processes and such. There may be other embodiments of the subject application which are not specifically illustrated. The specification and drawings are to be regarded as illustrative rather than restrictive. Modifications may be made to adapt a particular situation, material, composition of matter, method, or process to the objective, spirit and scope of the subject application. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the subject application. Therefore, unless specifically indicated herein, the order and grouping of the operations are not limitations of the subject application.

What is claimed is:

1. A semiconductor device package, comprising:
 a first semiconductor device having a first surface;
 an interconnection element having a surface substantially coplanar with the first surface of the first semiconductor device;
 a first encapsulant encapsulating the first semiconductor device and the interconnection element, wherein the first encapsulant extends to the first surface of the first semiconductor device and extends to the surface of the interconnection element;
 a second semiconductor device disposed on and across the first semiconductor device and the interconnection element;
 a light emitting device disposed on the first surface of the first semiconductor device, wherein the light emitting device occupies a first area on the first surface of the first semiconductor device; and
 a first redistribution layer disposed on a second surface of the first semiconductor device, wherein the second surface of the first semiconductor device is opposite to the first surface of the first semiconductor device, and wherein the first redistribution layer defines a first opening having a second area greater than the first area.

2. The semiconductor device package of claim 1, wherein the first surface of the first semiconductor device is exposed from the first encapsulant.

3. The semiconductor device package of claim 1, wherein the first semiconductor device comprises a guiding element adjacent to the first surface of the first semiconductor device.

4. The semiconductor device package of claim 3, wherein the guiding element comprises a grating structure exposed from the first encapsulant.

5. The semiconductor device package of claim 1, wherein the first semiconductor device has a third surface adjacent to the first surface of the first semiconductor device, and the third surface of the first semiconductor device is exposed from the first encapsulant.

6. The semiconductor device package of claim 5, wherein the first semiconductor device comprises a guiding element adjacent to the third surface of the first semiconductor device, and wherein the guiding element is exposed from the first encapsulant.

7. The semiconductor device package of claim 5, wherein the first semiconductor device has a fourth surface adjacent to the third surface of the first semiconductor device, and the fourth surface of the first semiconductor device is exposed from the first encapsulant.

8. The semiconductor device package of claim 7, wherein the fourth surface of the first semiconductor device is substantially parallel to the first surface of the first semiconductor device.

9. The semiconductor device package of claim 7, wherein the first semiconductor device has a fifth surface adjacent to the fourth surface of the first semiconductor device, and the fifth surface of the first semiconductor device is exposed from the first encapsulant.

10. The semiconductor device package of claim 1, wherein a recess is defined by the first surface of the first semiconductor device and is adjacent to an edge of the first semiconductor device.

11. The semiconductor device package of claim 10, wherein the first semiconductor device comprises a guiding element exposed from the first encapsulant, and wherein the guiding element is exposed to the recess.

12. The semiconductor device package of claim 11, wherein the first semiconductor device comprises a detector.

13. The semiconductor device package of claim 1, wherein the first semiconductor device comprises a guiding element configured to receive light emitted from the light emitting device.

14. The semiconductor device package of claim 1, further comprising a second redistribution layer on the first surface of the first semiconductor device.

15. The semiconductor device package of claim 1, wherein the first semiconductor device, the interconnection element and the second semiconductor device are electrically connected.

16. The semiconductor device package of claim 1, further comprising a first via between the first semiconductor device and the second semiconductor device, and a second via between the interconnection element and the second semiconductor device, wherein a height of the first via is substantially equal to a height of the second via.

17. The semiconductor device package of claim 1, wherein the first surface of the first semiconductor device is substantially parallel to a first surface of the second semiconductor device, and the first surface of the second semiconductor device faces the first surface of the first semiconductor device.

18. The semiconductor device package of claim 1, wherein the second semiconductor device has a surface facing the surface of the interconnection element, and the surface of the interconnection element is substantially parallel to the surface of the second semiconductor device.

19. The semiconductor device package of claim 1, further comprising a second redistribution layer on the first surface of the first semiconductor device and the surface of the interconnection element, wherein the second redistribution layer extends across the first semiconductor device and the interconnection element.

20. The semiconductor device package of claim 1, wherein the first semiconductor device comprises an optoelectronic converter.

21. The semiconductor device package of claim 1, further comprising a second encapsulant disposed between the second semiconductor device and the first encapsulant.

22. The semiconductor device package of claim 1, wherein the first encapsulant encapsulates an entire sidewall of the first semiconductor device and an entire sidewall of the interconnection element.

23. The semiconductor device package of claim 1, wherein a first surface of the first encapsulant is coplanar with the first surface of the first semiconductor device.

\* \* \* \* \*